US011107890B2

(12) United States Patent
Dewey et al.

(10) Patent No.: US 11,107,890 B2
(45) Date of Patent: Aug. 31, 2021

(54) FINFET TRANSISTOR HAVING A DOPED SUBFIN STRUCTURE TO REDUCE CHANNEL TO SUBSTRATE LEAKAGE

(71) Applicant: Intel Corporation, Santa Clara, CA (US)

(72) Inventors: Gilbert Dewey, Hillsboro, OR (US); Matthew V. Metz, Portland, OR (US); Willy Rachmady, Beaverton, OR (US); Anand S. Murthy, Portland, OR (US); Chandra S. Mohapatra, Beaverton, OR (US); Tahir Ghani, Portland, OR (US); Sean T. Ma, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 11 days.

(21) Appl. No.: 16/095,287

(22) PCT Filed: Jun. 30, 2016

(86) PCT No.: PCT/US2016/040559
§ 371 (c)(1),
(2) Date: Oct. 19, 2018

(87) PCT Pub. No.: WO2018/004630
PCT Pub. Date: Jan. 4, 2018

(65) Prior Publication Data
US 2019/0140054 A1    May 9, 2019

(51) Int. Cl.
*H01L 29/10* (2006.01)
*H01L 29/66* (2006.01)
*H01L 29/78* (2006.01)

(52) U.S. Cl.
CPC .......... *H01L 29/1054* (2013.01); *H01L 29/66* (2013.01); *H01L 29/66795* (2013.01); *H01L 29/785* (2013.01); *H01L 29/7851* (2013.01)

(58) Field of Classification Search
CPC . H01L 29/1054; H01L 29/66; H01L 29/7851; H01L 29/785; H01L 29/66795
See application file for complete search history.

(56) References Cited

U.S. PATENT DOCUMENTS 9,379,244 B2* 6/2016 Hur .................... H01L 21/02532
10,068,963 B2* 9/2018 Chiang ............. H01L 21/76871
(Continued)

OTHER PUBLICATIONS

International Search Report and Written Opinion for International Patent Application No. PCT/US2016/040559 dated Mar. 31, 2017, 12 pgs.
(Continued)

*Primary Examiner* — David Vu
(74) *Attorney, Agent, or Firm* — Schwabe, Williamson & Wyatt, P.C.

(57) ABSTRACT

An apparatus is described. The apparatus includes a FINFET device having a channel. The channel is composed of a first semiconductor material that is epitaxially grown on a subfin structure beneath the channel. The subfin structure is composed of a second semiconductor material that is different than the first semiconductor material. The subfin structure is epitaxially grown on a substrate composed of a third semiconductor material that is different than the first and second semiconductor materials. The subfin structure has a doped region to substantially impede leakage currents between the channel and the substrate.

14 Claims, 18 Drawing Sheets

(56) References Cited

U.S. PATENT DOCUMENTS

| | | |
|---|---|---|
| 2011/0210374 A1 | 9/2011 | Lochtefeld |
| 2013/0228832 A1 | 9/2013 | Mieno |
| 2014/0061820 A1* | 3/2014 | Reznicek ........ H01L 21/823821 257/401 |
| 2015/0145064 A1 | 5/2015 | Ramachandran et al. |
| 2015/0340502 A1 | 11/2015 | Ponoth et al. |
| 2016/0181247 A1 | 6/2016 | Anderson et al. |

OTHER PUBLICATIONS

International Preliminary Report on Patentability for International Patent Application No. PCT/US2016/040559, dated Jan. 10, 2019, 9 pages.

Office Action for Taiwan Patent Application No. 106116712, dated Oct. 15, 2020, 15 pages.

Office Action from Taiwan Patent Application 106116712, dated Mar. 16, 2021, 5 pgs.

* cited by examiner

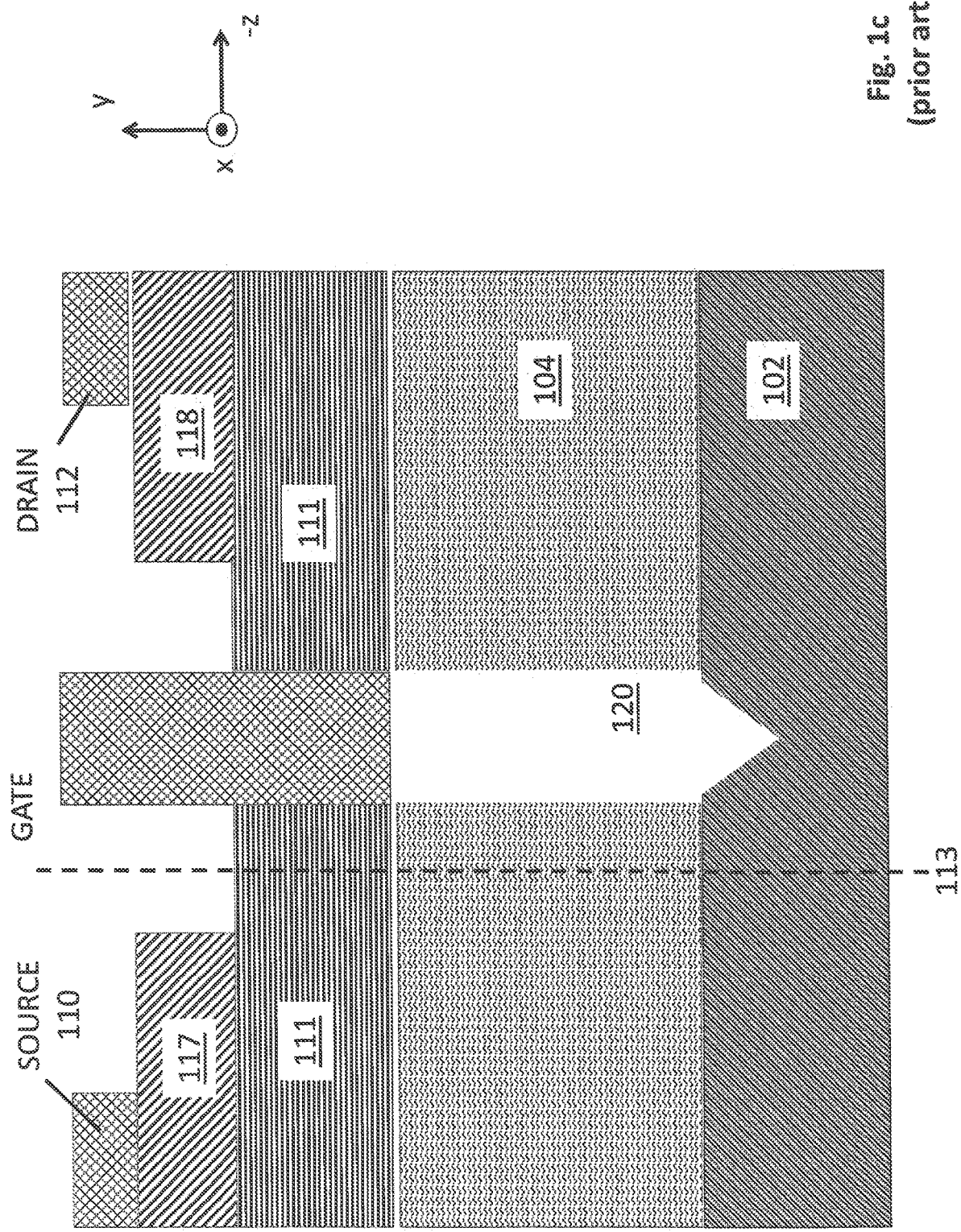

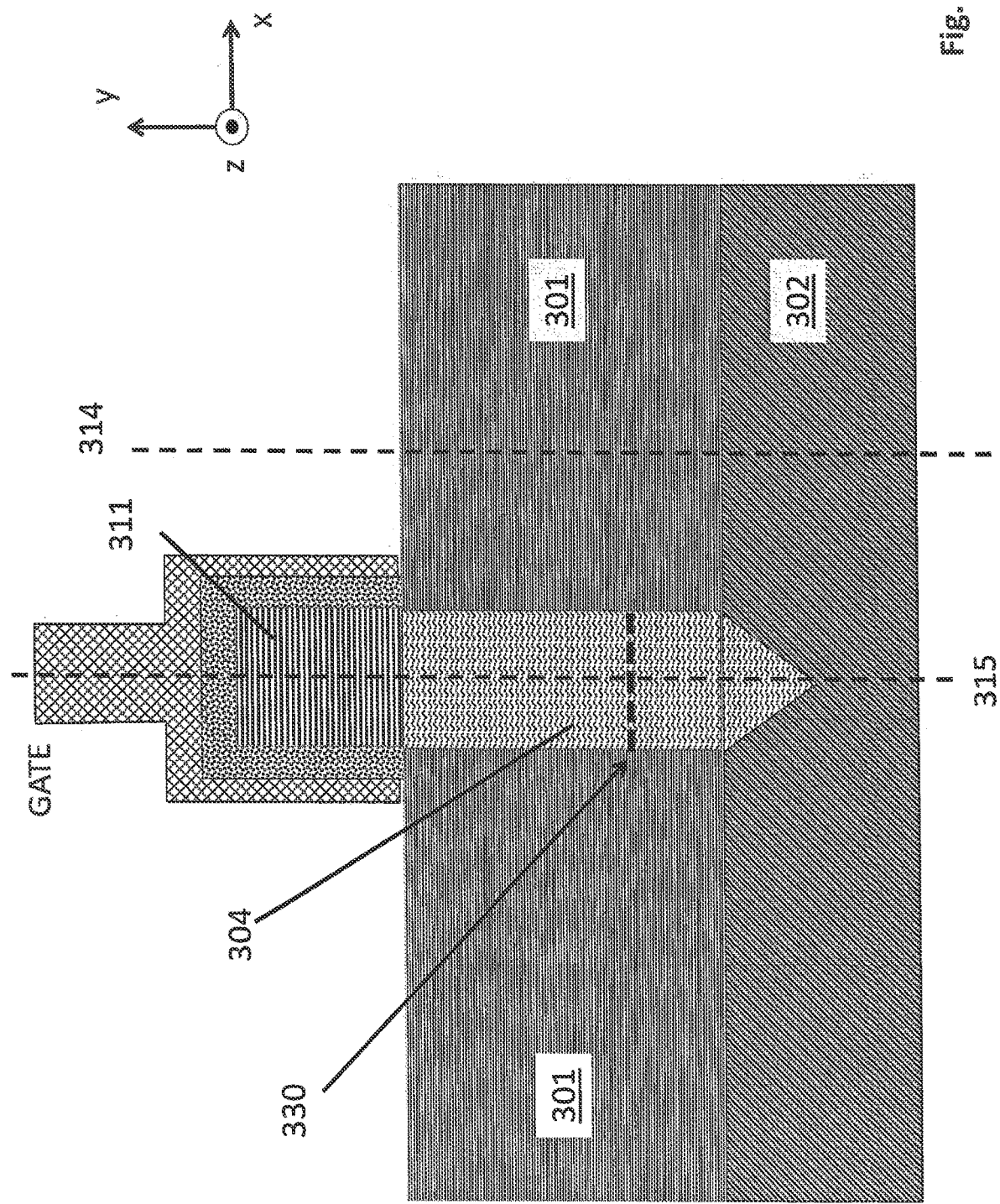

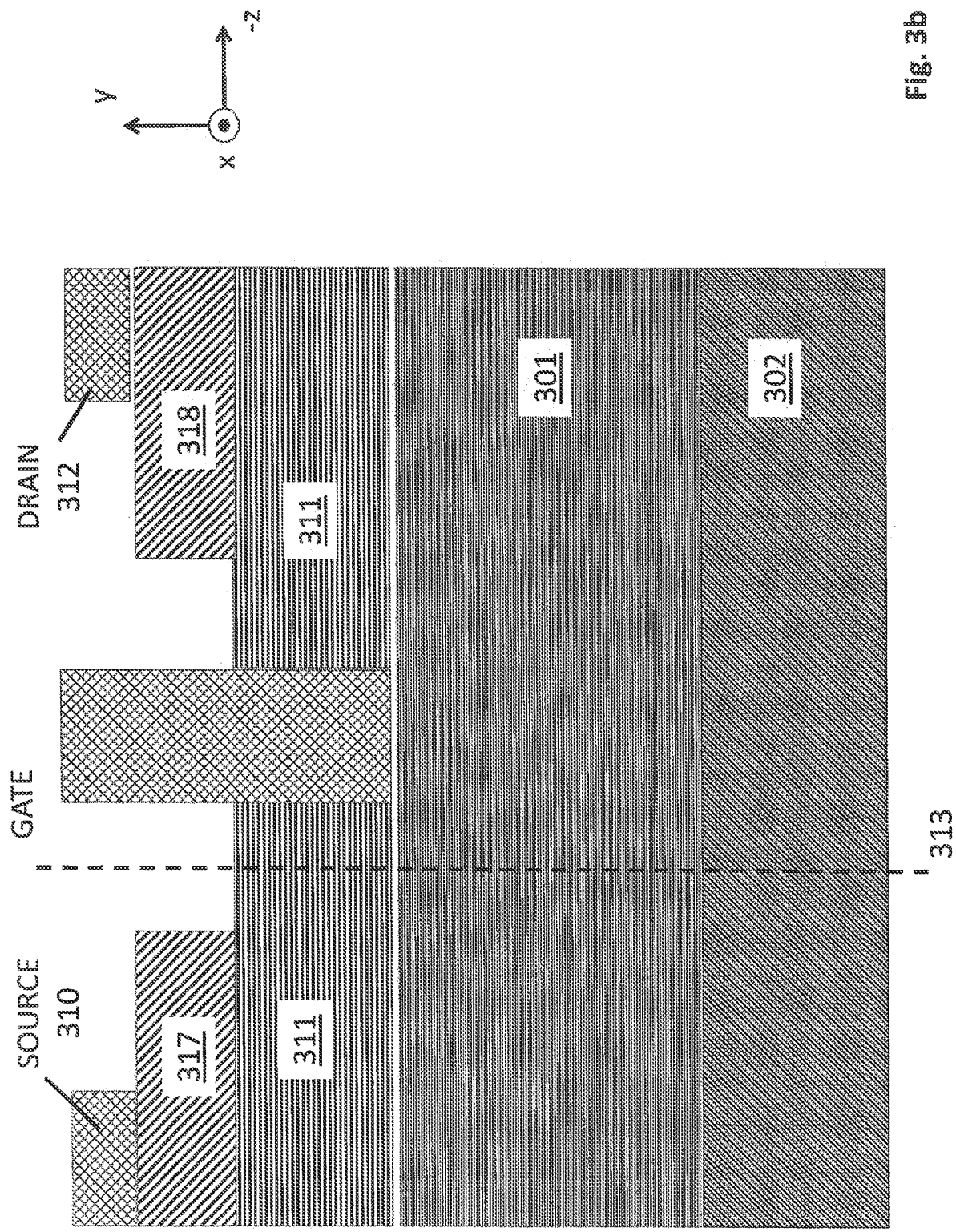

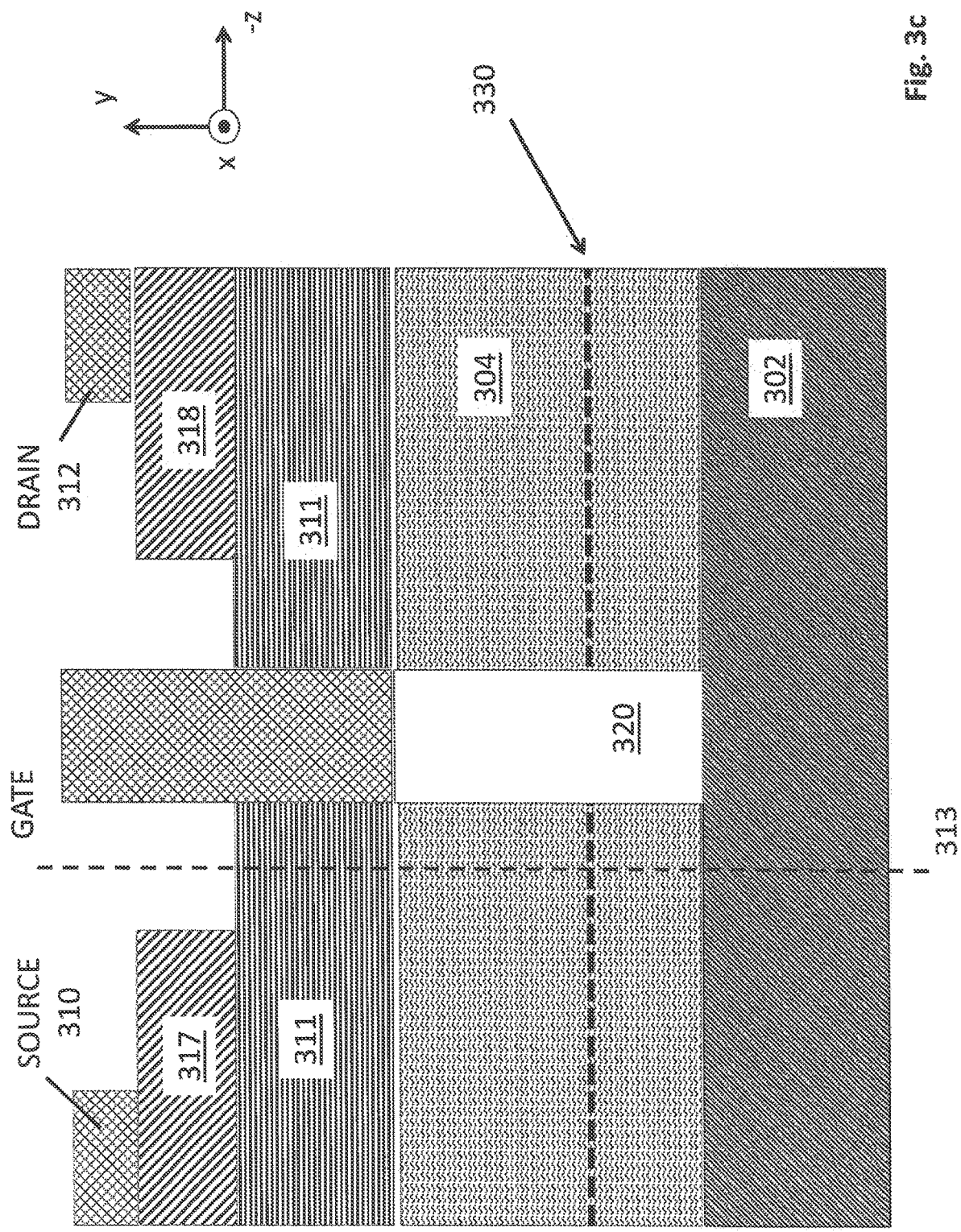

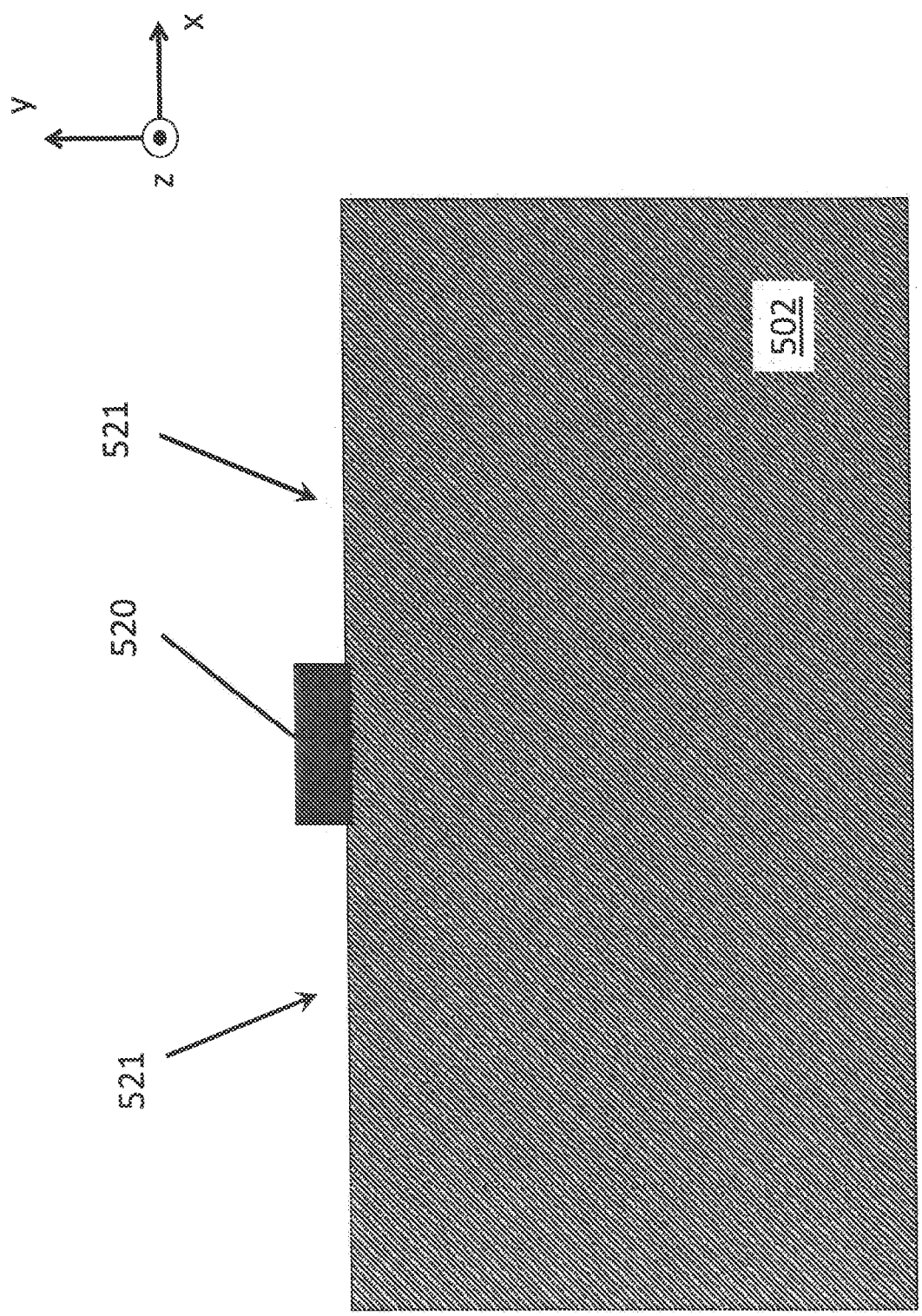

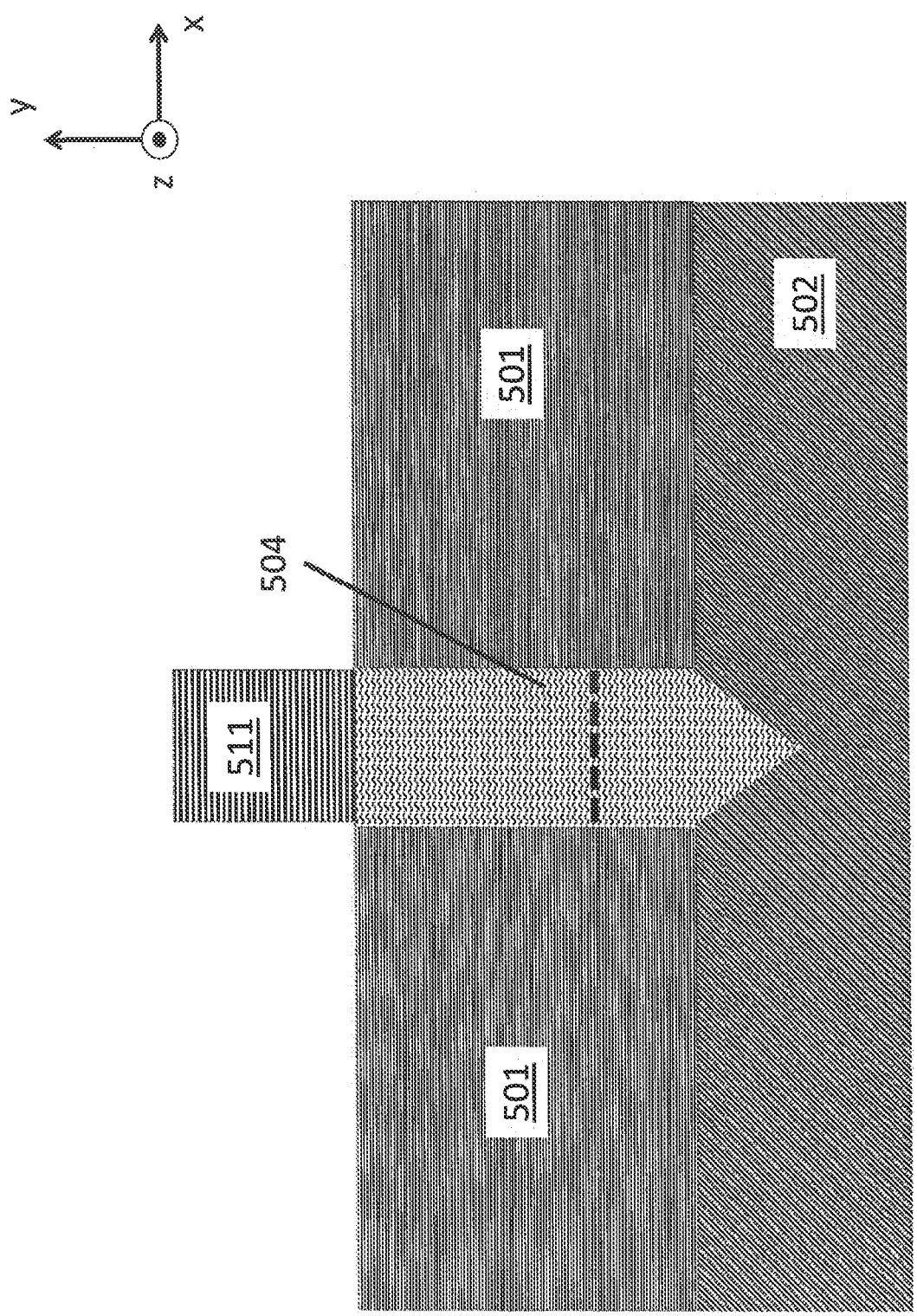

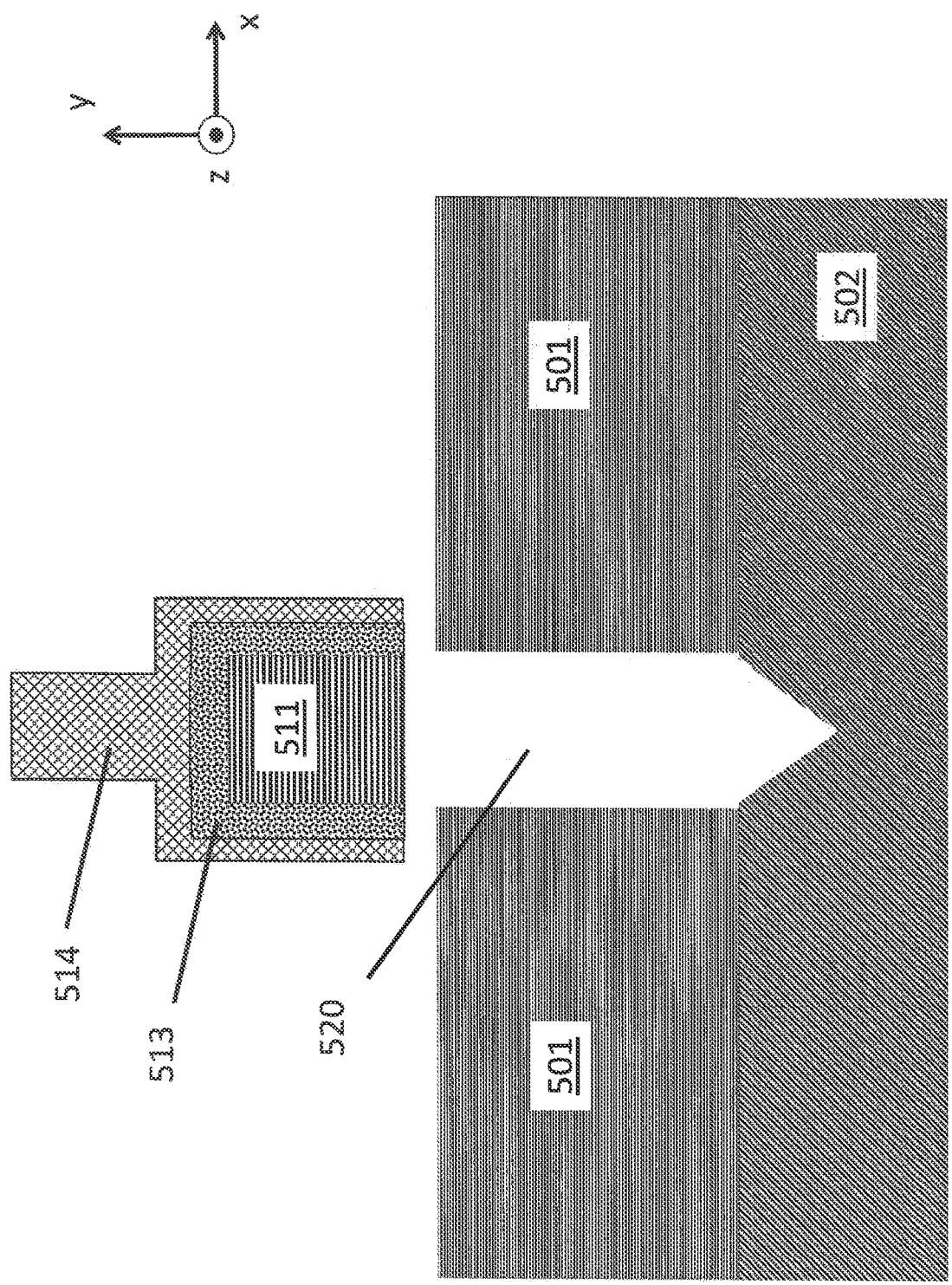

FINFET TRANSISTOR HAVING A DOPED SUBFIN STRUCTURE TO REDUCE CHANNEL TO SUBSTRATE LEAKAGE

CROSS-REFERENCE TO RELATED APPLICATION

This patent application is a U.S. National Phase Application under 35 U.S.C. § 371 of International Application No. PCT/US2016/040559, filed Jun. 30, 2016, entitled "A FINFET TRANSISTOR HAVING A DOPED SUBFIN STRUCTURE TO REDUCE CHANNEL TO SUBSTRATE LEAKAGE," which designates the United States of America, the entire disclosure of which is hereby incorporated by reference in its entirety and for all purposes.

FIELD OF INVENTION

The field of invention is directed to the semiconductor arts, generally, and, more specifically, to a FINFET transistor having a doped subfin structure to reduce channel to substrate leakage.

BACKGROUND

Leakage currents can be a particularly troublesome problem for extremely small transistor devices. Here, not only are extremely small transistors more prone to leakage, but also, owing to their extremely small size, extremely large numbers of such transistors can be monolithically integrated on a single semiconductor die which compounds the power consumption problem for the semiconductor die as a whole. Semiconductor manufacturing engineers are therefore continually seeking ways to improve the power consumption of their transistor devices.

FIGURES

A better understanding of the present invention can be obtained from the following detailed description in conjunction with the following drawings, in which:

FIGS. 1a, 1b and 1c (prior art) show different perspectives of a FINFET device;

FIGS. 3a, 3b and 3c show different perspectives of an improved FINFET device;

FIGS. 5a through 5i show a method of manufacturing the FINFET device of FIG. 3;

DETAILED DESCRIPTION

Figure 1A:
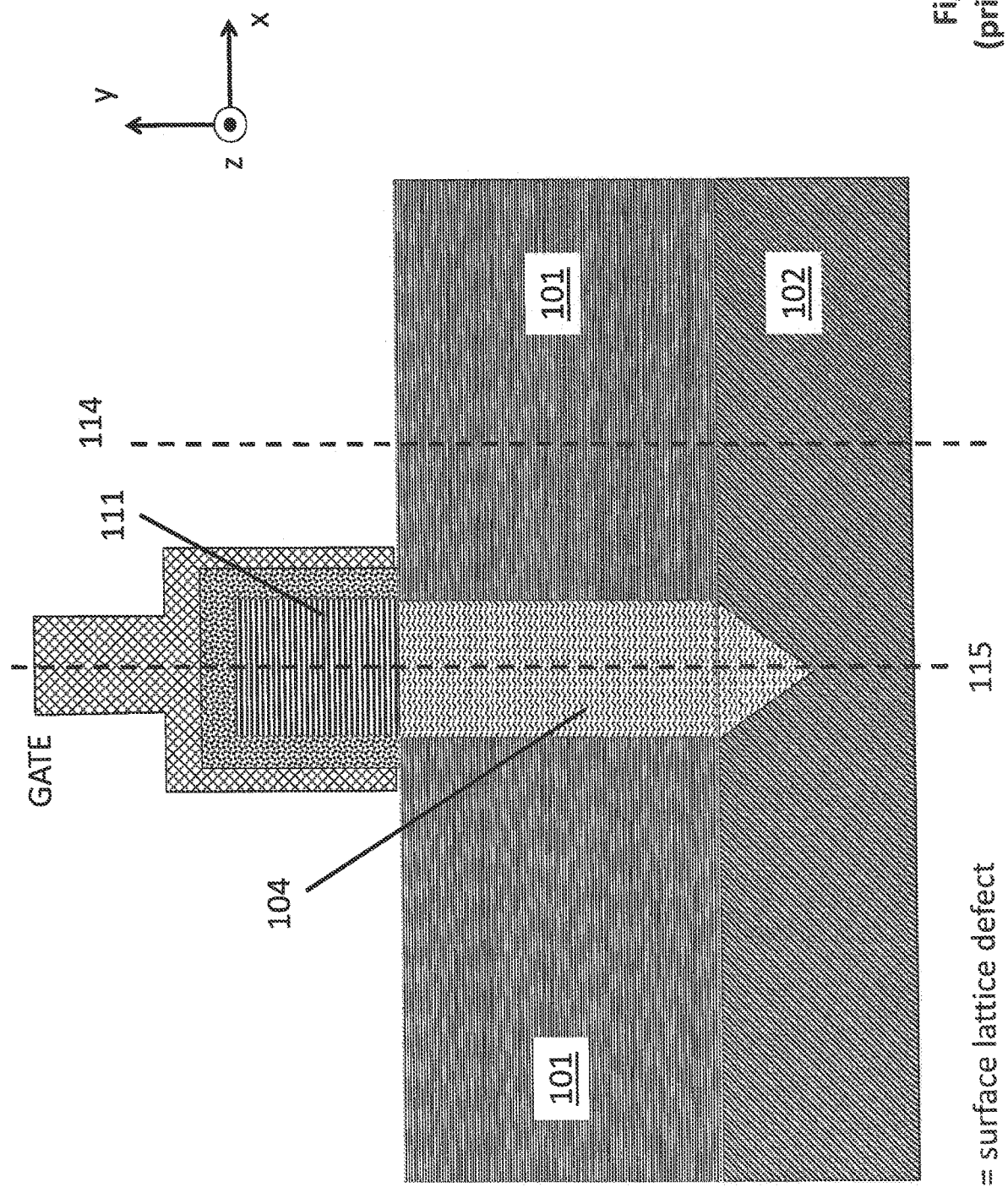
Figure 1B:
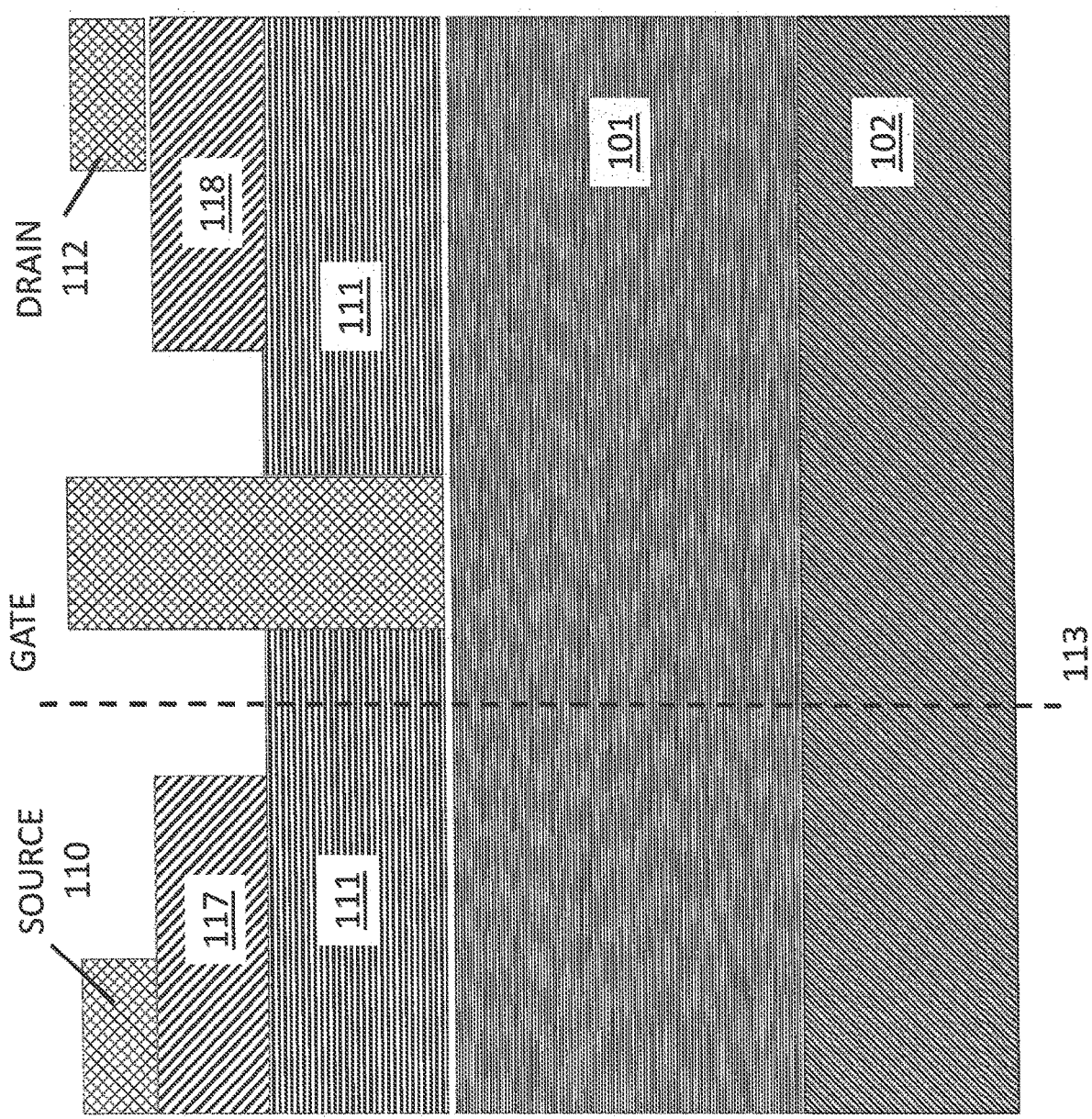

FIG. 1a shows a widthwise cross section of a prior art fin field effect transistor (FINFET) transistor while FIGS. 1b and 1c shows lengthwise cross sections of the same FINFET transistor along different axis'. FIG. 1b shows a lengthwise cross section of the device that lies along a yz plane that is positioned at axis 114 of FIG. 1a. FIG. 1c shows a lengthwise cross section of the device that lies along a yz plane that is positioned at axis 115 of FIG. 1a. The cross section of FIG. 1a is taken from the perspective of xy oriented plane 113 in FIGS. 1b and 1c looking in the −z direction toward the gate (so that the gate can be seen).

As will be made more clear in the following discussion, a comparison of both of FIGS. 1b and 1c against one another and against FIG. 1a reveals that a subfin structure 104 runs directly beneath a channel region 111 from the source to the drain (except directly beneath the gate) whereas dielectric 101 resides on either side of the subfin structure 104 in areas that are not directly beneath the channel 111.

As is known in the art, a FINFET transistor is composed of a channel region 111 that extends up from a surface of a semiconductor chip in the form of a fin. Referring to FIG. 1c, in the active mode, electrons flow from left to right in the −z direction from the source contact 110 through the channel 111 and then into the drain contact 112. As such, current flows "into the page" of FIG. 1a within channel region 111. The channel region 111 is continuous and extends between the source and drain nodes including directly beneath the gate.

The channel region 111, which in various embodiments is composed of indium gallium arsenide is grown on the subfin structure 104 which in an embodiment is composed of any of gallium arsenide, indium phosphide, indium aluminum arsenide, indium arsenide, indium gallium arsenide, indium antimony or indium arsenide antimony. The subfin material 104 is removed directly beneath the gate leaving a void 120 beneath the gate. In other embodiments the void 120 beneath the gate may be filled with a dielectric such as silicon dioxide. The void/oxide beneath the gate ensures that currents between the source and drain will substantially flow only through the channel region 111. The subfin structure 104 is epitaxially grown on a lower semiconductor substrate 102 within a void that is etched into a dielectric layer 101.

The lower substrate 102 is composed of a different material (such as silicon) than the subfin structure 104 thereby forming a hetero-structure at the subfin 104/lower substrate 102 interface.

Figure 2:
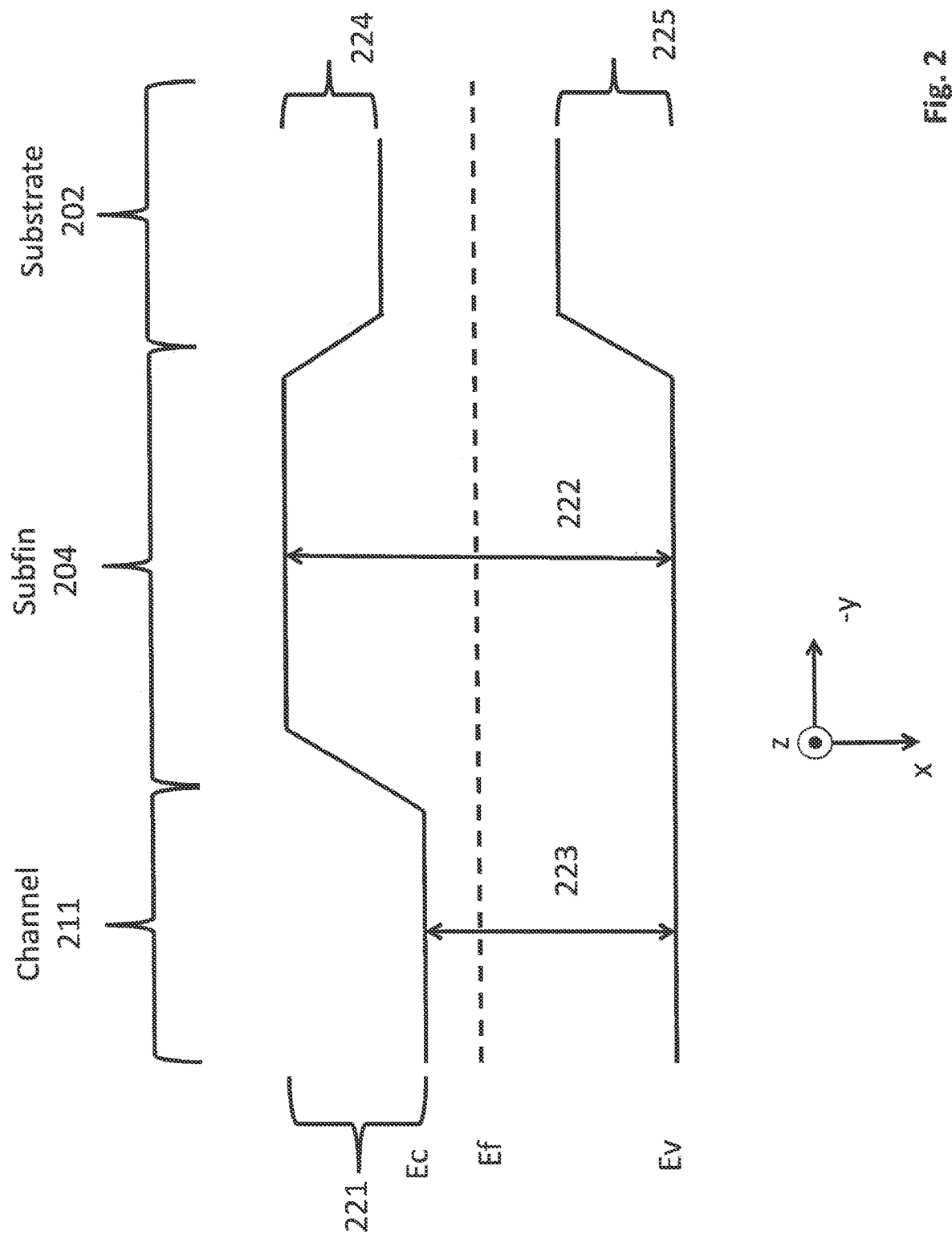
FIG. 2 shows a energy band diagram of the prior art FINFET device.

In nominal FINFET designs, referring to FIG. 2, the subfin 204 material is kept intrinsic. That is, it is not substantially doped n type or p type in an attempt to rely on the subfin material's particularly high bandgap energy to prevent leakage currents that could pass through the subfin structure 204 between the channel 211 and the substrate 202. For example, in an embodiment where the channel 211 is composed of indium gallium arsenide and the subfin 204 is composed of gallium arsenide, the pure gallium arsenide in the subfin 204 has an energy bandgap 222 of 1.44 eV whereas the introduction of indium to the gallium arsenide in the channel 211 reduces the bandgap 223 of the channel 211 to something that is appreciably lower than 1.44 ev.

As can be seen from the exemplary energy band diagram of FIG. 2, with the channel 211 being doped n type, there exists a modest energy barrier 221 that thwarts the flow of electrons from the channel 211 to the substrate 202 along the conduction band (Ec). Likewise, owing to the lower energy bandgap substrate material 202 (e.g., silicon having an energy band gap of 1.11 ev), there also exists a modest barrier 224 that thwarts the flow of electrons from the substrate 202 into the subfin 204.

With respect to the hole based currents, there exists a nominal barrier 225 that thwarts the flow of holes from the substrate 202 to the subfin 204 along the valence band (Ec). Very little barrier, if any, exists between the subfin 204 and the channel 211. Thus, whereas there exists modest barriers 223, 224 that thwart the flow of electrons in either direction along the conduction band, there is only a modest barrier 225 in the valence band that thwarts the flow of holes in only the direction from the substrate 202 to the channel 211. Thus, as observed, the ability of the prior art channel/subfin/ substrate system to prevent leakage currents between the substrate 202 and channel 211 is only modest at best.

The diagram of FIG. 2 depicts a zero bias state in which no external potential is being applied to any of the channel 211, subfin 204, or substrate 202. Here, some potential could be applied, e.g., to the substrate 202 to alter some of the barrier heights observed in FIG. 2. However, except in the case of extremely large applied voltages, the increasing of one of barriers 224, 225 results in the lessening of the other of barriers 224, 225. Said another way, e.g., if a +1.0 V bias were applied to substrate 202, the height of barrier 224 would increase but the height of barrier 225 would decrease. A similar situation would exist if potential were to be applied to the subfin 204. Thus, the tendency of the barrier heights to work against one another in response to an applied bias voltage at the substrate 202 or subfin 204 results in applied bias having limited effect.

FIGS. 3a through 3c show an improved transistor having a deep p doped region 330 within the subfin 304. Because the p doped region 330 resides in the subfin 304, it is observable in FIG. 3a (which shows a widthwise cross section of the device viewed from the xy plane located along axis 313 looking in the −z direction toward the gate so) and FIG. 3c (which shows a lengthwise cross section of the device through the channel 311 and subfin 304) but is not observable in FIG. 3b (which shows a lengthwise cross section of the device through the dielectric 301 that is off to the side of the subfin 304). As with the device of FIGS. 1a,b,c there is a void/oxide 320 in the subfin layer 304 directly beneath the gate.

Figure 4:
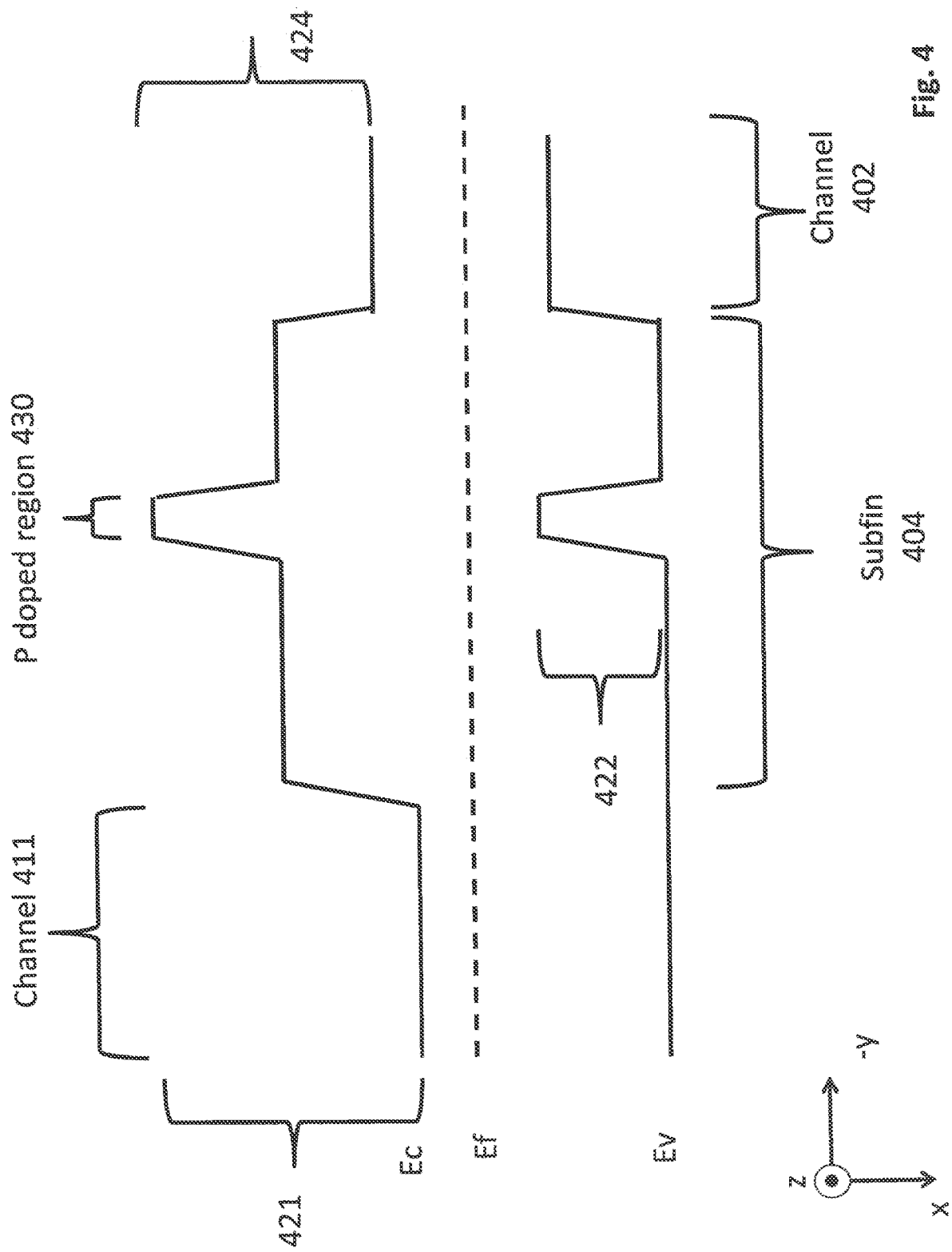
FIG. 4 shows an energy band diagram of the improved FINFET device.

The effect of the p doped region 330 on the energy band diagram of the channel/subfin/substrate system is presented in FIG. 4. Noticeably, the conduction band (Ec) shows a substantially larger barrier to electron flow in either direction (channel 411 to substrate 401, or, substrate 401 to channel 411) than the comparable barriers in FIG. 2. Specifically, for instance, barrier 421 is much larger than barrier 221 and barrier 424 is much larger than barrier 224. The lowest energy state for electrons is to drop down to the lowest conduction band level making the surpassing over barriers 421, 424 extremely unlikely.

As such, whereas the barriers 221, 224 to electron flow in either direction were modest in the prior art device of FIG. 2, by contrast, such barriers 421, 424 in the improved device of FIG. 4 are substantial. The barrier height increase in the improved device of FIGS. 3a through 3c are therefore realized as substantially reduced electron flow based leakage currents between channel 311 and substrate 302 as compared to the prior art device of FIGS. 2a through 2c.

Likewise, the valence band (Ev) of FIG. 4 shows a substantially improved impediment to hole flow in either direction (channel 411 to substrate 401, or, substrate 401 to channel 411) than the comparable barrier 225 in FIG. 2. Specifically, valence band structure 422 corresponds to a quantum well for holes that will trap holes as they travel through the subfin 404 in either direction. Here, the lowest energy state of a hole is to "bubble up" to the highest valence band level and remain there.

As such, whereas a single barrier 225 to hole flow in only one direction was realized in the prior art device of FIG. 2, by contrast, quantum well 422 impedes hole flow in either direction in the improved device of FIG. 4. The quantum well 422 that is formed in the p dopant region 430 in the improved device of FIGS. 3a through 3c therefore substantially reduces hole flow based leakage currents between channel 411 and substrate 402 in the improved device of FIGS. 3a through 3c as compared to the prior art device of FIGS. 2a through 2c.

Referring back to FIGS. 3a and 3c, note that the p doped region 330 can be located fairly deep within the body of the subfin 304. In various embodiments, the p doped region 330 is deep enough beneath the channel 311 so as to not create any substantial lattice defects in the channel 311 or other channel 311 imperfections on account of the existence of the p doped region 330. In one or more such embodiments, e.g., the dopant region 330 is closer to the substrate 302 than to the channel 311.

Another reason for the existence of barrier layer 330 is that a lattice mismatch may exist at the interface of channel 311 and subfin 304 and also at the interface of subfin 304 and substrate 302. These lattice mismatches can create defects and resultant current leakage paths that can increase the leakage to the substrate 302 despite there being a barrier at those interfaces. Having the doped layer 330 in material 304 effectively inserts a pn junction away from both of these interfaces and in the largest band gap material to create the largest barrier to current flow to the substrate without encountering the non-idealities of defective interfaces. In various embodiments the doping layer 330 is not close to the bottom of the channel material 311 so as to void the inducement of scattering in the channel material 311 which would and lower the mobility of the channel region 311.

FIGS. 5a through 5i show an embodiment of a method of manufacturing the improved device of FIGS. 3a through 3b. As observed in FIG. 5a, a lower substrate of a first semiconductor material 502 (e.g., silicon) is coated with photoresist 520 which is patterned to expose openings 521 that correspond to the regions where the subfin will eventually be formed.

Figure 5B:
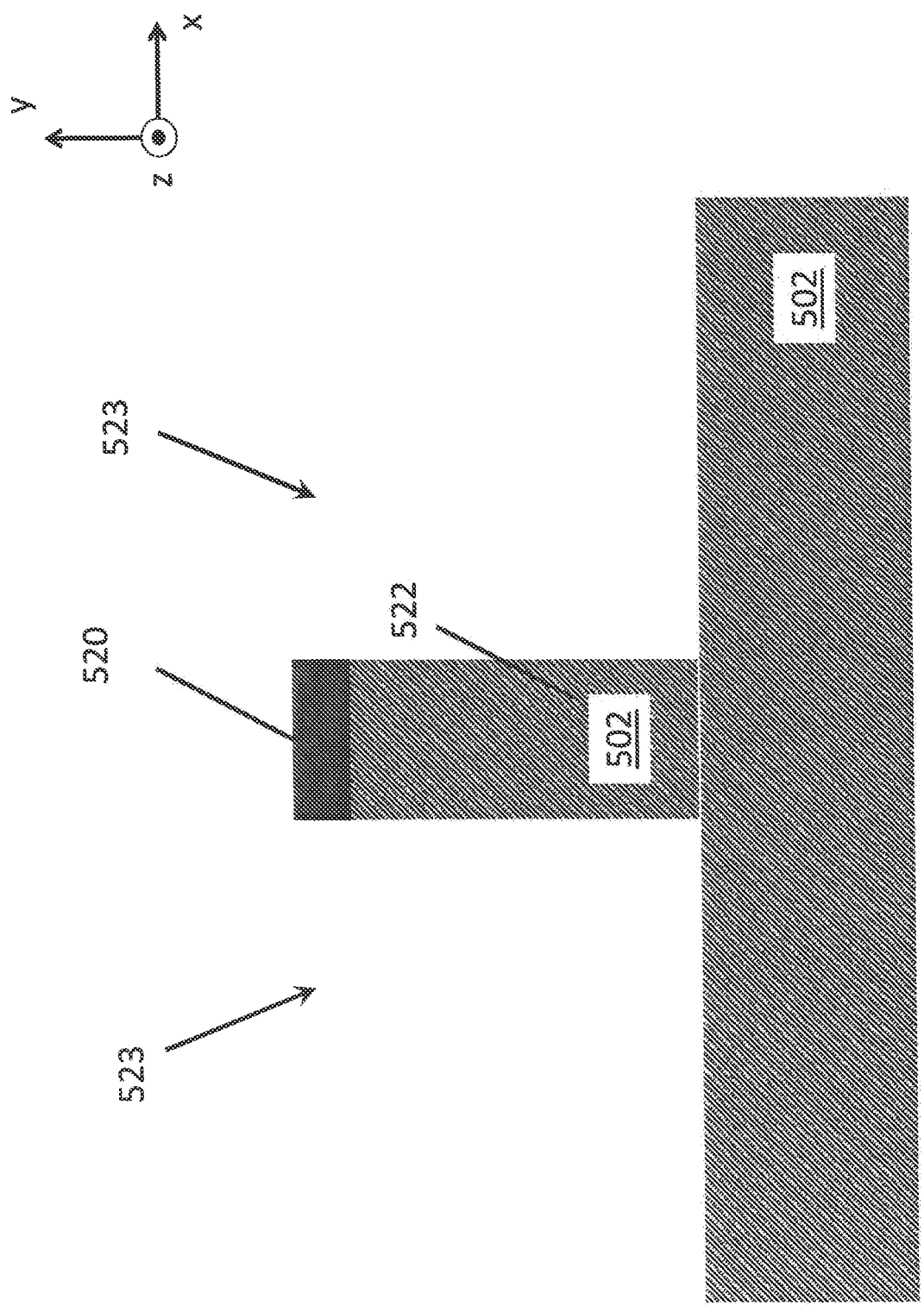
Figure 5C:
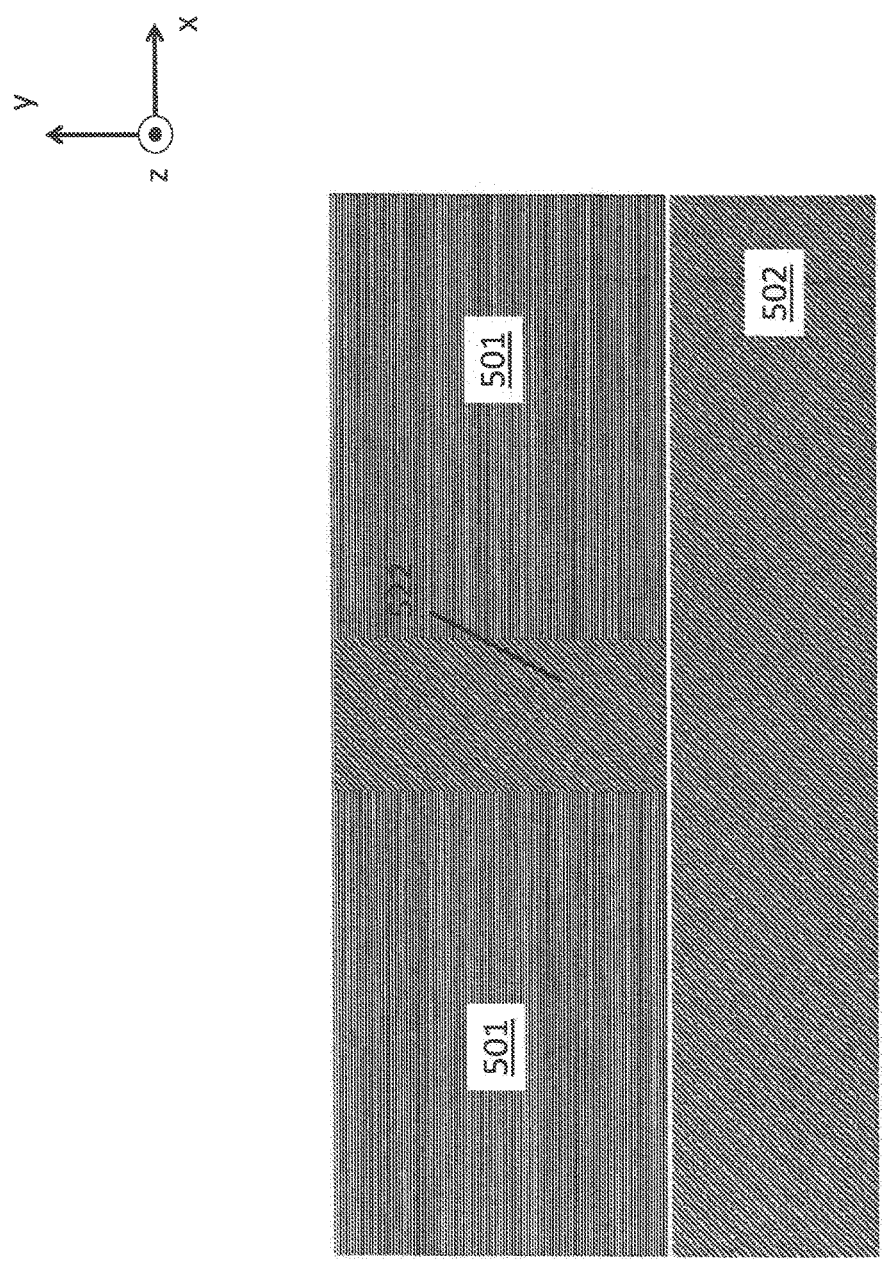

As observed in FIG. 5b, the lower substrate semiconductor 502 is then etched through the openings 521 to form dummy fin structure 522 and large voids 523 in the lower substrate 502. The large voids 523 that are created from the etch are then back filled with dielectric (e.g., silicon dioxide) 501 so as to cover the dummy fin 522. As observed in FIG. 5c, the entire structure is then polished down until the tip of the dummy fin 522 is exposed.

Figure 5D:
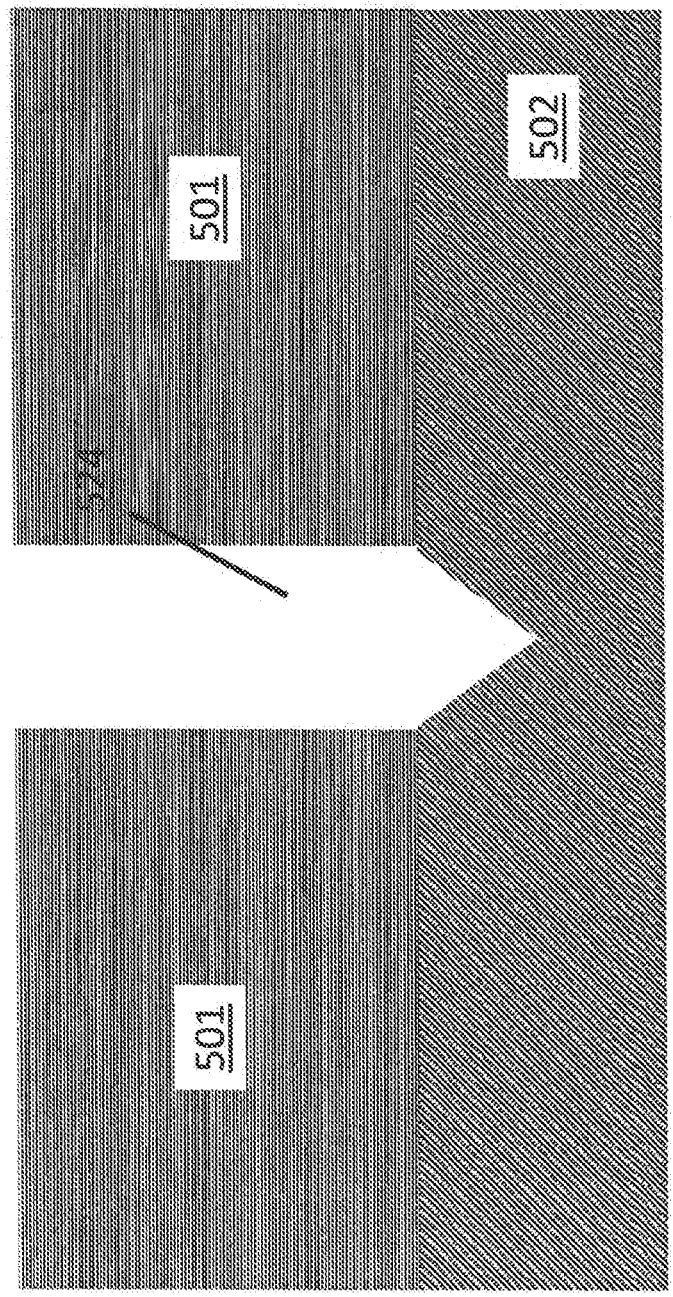

As observed in FIG. 5d, a selective etch that etches the lower substrate material 502 but not the dielectric 501 is applied to the overall structure. As such, the selective etch etches the dummy fin structure 522 but not the dielectric 501 leaving a void 524 in the dielectric material 501. In an embodiment, the chemistry of the etch causes an etch direction that angles into the lower substrate 502 material rather than etches directly "down" into the lower substrate 502 material which results in a spike shaped etch region in the lower substrate 502. In an embodiment, where the lower substrate 502 is silicon having a <1, 0, 0> orientation and the etch is a tetramethylammonium hydroxide (TMAH) etch, the TMAH etch will etch along a <1, 1, 1> orientation which causes the etch to etch at angles of approximately 45° into the silicon substrate 502.

Figure 5E:
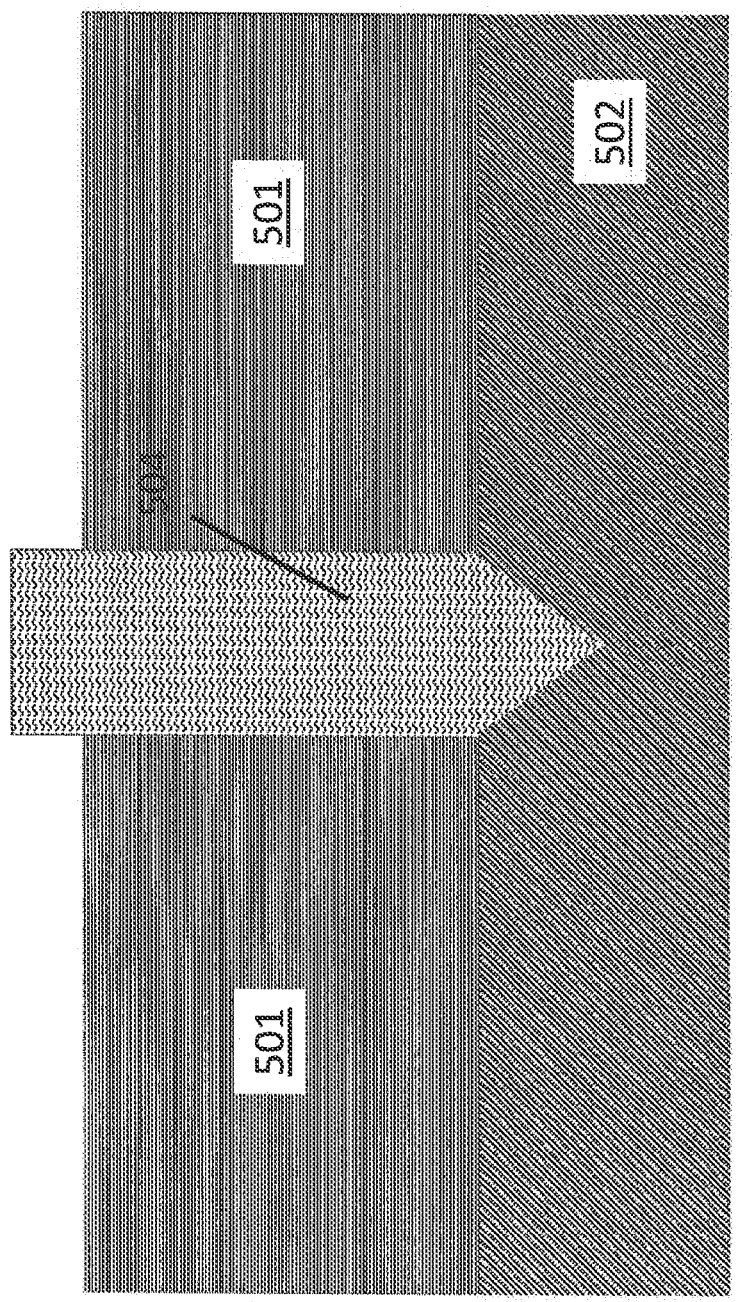

After the selective etch of FIG. 5d, as observed in FIG. 5e, a second semiconductor material 504 (e.g., gallium arsenide, indium phosphide, indium aluminum arsenide, indium arsenide, indium gallium arsenide, indium antimony or indium arsenide antimony, etc.) that is different than the lower semiconductor material 502 is epitaxially grown in the void 524 formed by the preceding etch.

As observed in FIG. 5f, the epitaxially grown second semiconductor material 504 (and perhaps a thin upper surface of the dielectric 501) is polished down to expose a thin strip of the upper surface of the second material 504 that lies in the same plane as the upper surface of the dielectric 501. At this point the subfin 504 structure is essentially constructed with the exception of the p doped region.

As observed in FIG. 5g, the subfin structure 504 is doped with an acceptor type impurity (e.g., carbon, manganese, or zinc in any of a gallium arsenide, indium phosphide or indium aluminum arsenide) to form p doped region 530. The doping may be performed, e.g., by patterning the semiconductor surface to only expose the subfin regions and then performing a high energy implant of the dopant atoms. Alternatively, the dopant atoms may be introduced quasi in-situ during the growth of the subfin material 504 that occurs from FIG. 5d to FIG. 5e. For instance, the subfin material 504 may be grown to a depth that is at or just beyond the level where the p dopant is to be placed. Then, a low energy or diffusion type implant of acceptor impurities may be applied the partially constructed subfin 504 surface. After an anneal, the subfin 504 growth is continued until the structure of FIG. 5e is reached.

Figure 5H:
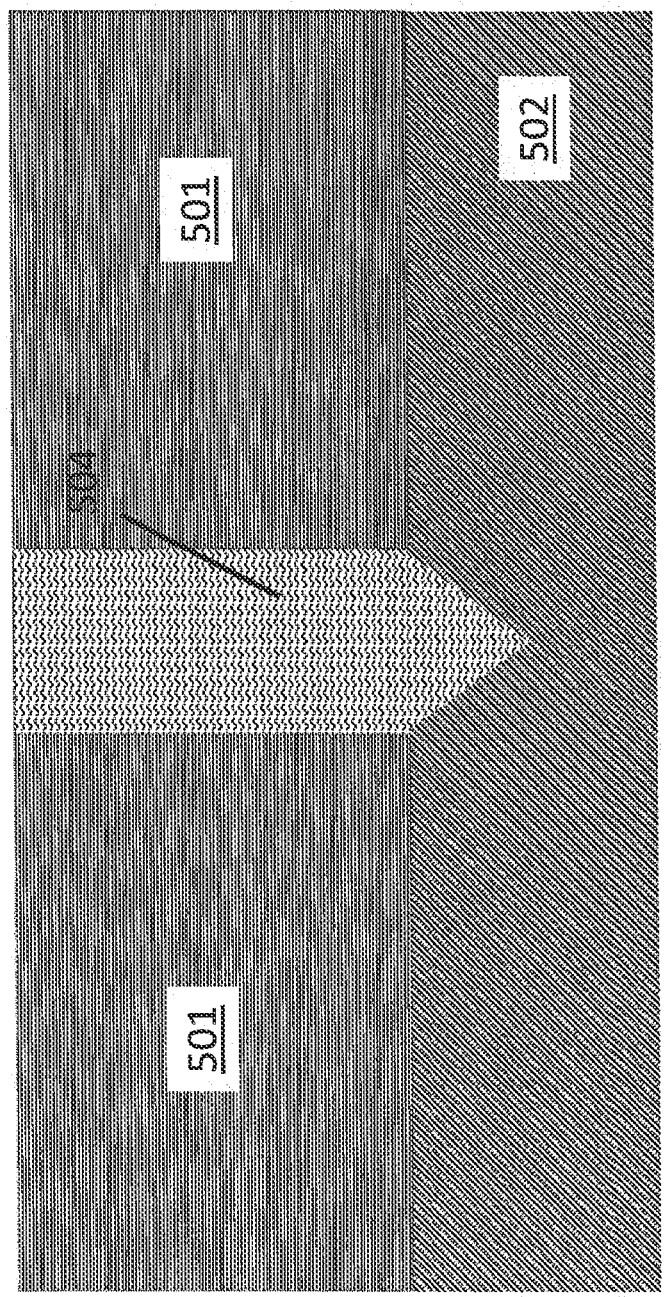
Figure 5B:
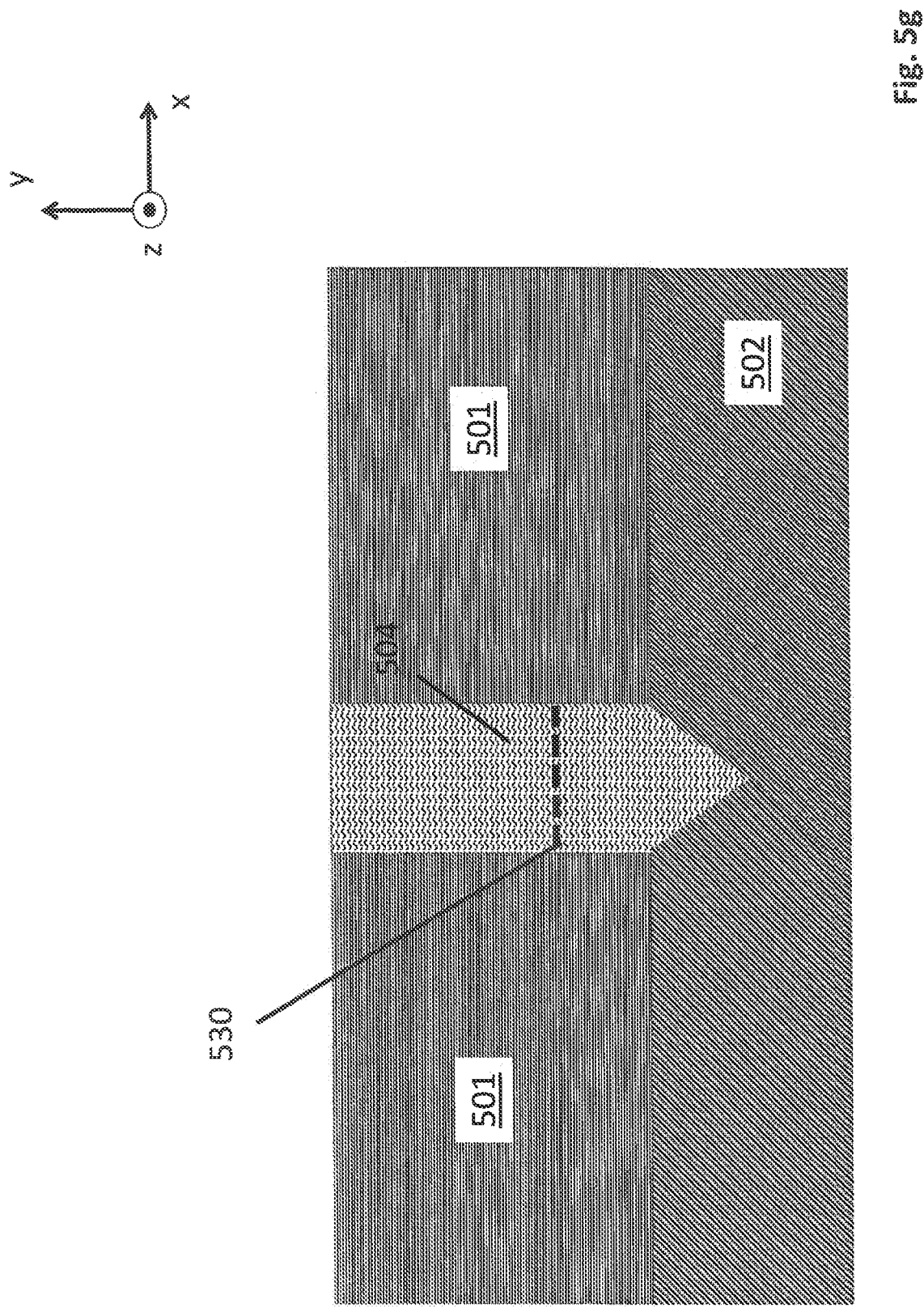

As observed in FIG. 5h, a third semiconductor material 511 (e.g., indium gallium arsenide), e.g., composed of different material than the first and second semiconductor materials 502, 504, is epitaxially grown on the subfin 404.

FIG. 5i shows additional processing that is undertaken directly at the gate region. Here, dielectric 501 is etched back to expose the upper region of the subfin material 504. A selective etch is then applied that etches the subfin material 504 but not the channel material 511. The etching of the subfin material 504 beneath the gate creates a void 520 beneath the gate (the channel 511 remains supported by the non recessed surface of dielectric 501 that exists directly beneath the channel 511 on both the source and drain sides of the gate). The void 520 may be subsequently filled with a dielectric such as silicon dioxide. For illustrative ease FIG. 5i only shows the void 520. The void/dielectric prevents "horizontal" leakage current between the source and drain within the subfin material 504. As such, the previously described doped region 530 substantially prevents "vertical" leakage current directly from a source or drain region to the substrate 502.

A high K dielectric material 513 is then deposited on the exposed channel material 511. Although not observable in the particular perspective of FIG. 5i, layers of semiconductor material are deposited on either side of the channel material 511 to form raised source and drain regions. Here, comparable structures are observed as structures 317, 118 in FIGS. 3b and 3c. Source, gate and drain metal nodes are then formed on the device in appropriate locations. FIGS. 3b and 3c show the placement of source 310 and drain 312 nodes. FIG. 5j shows the placement of the gate node 514.

Figure 6:
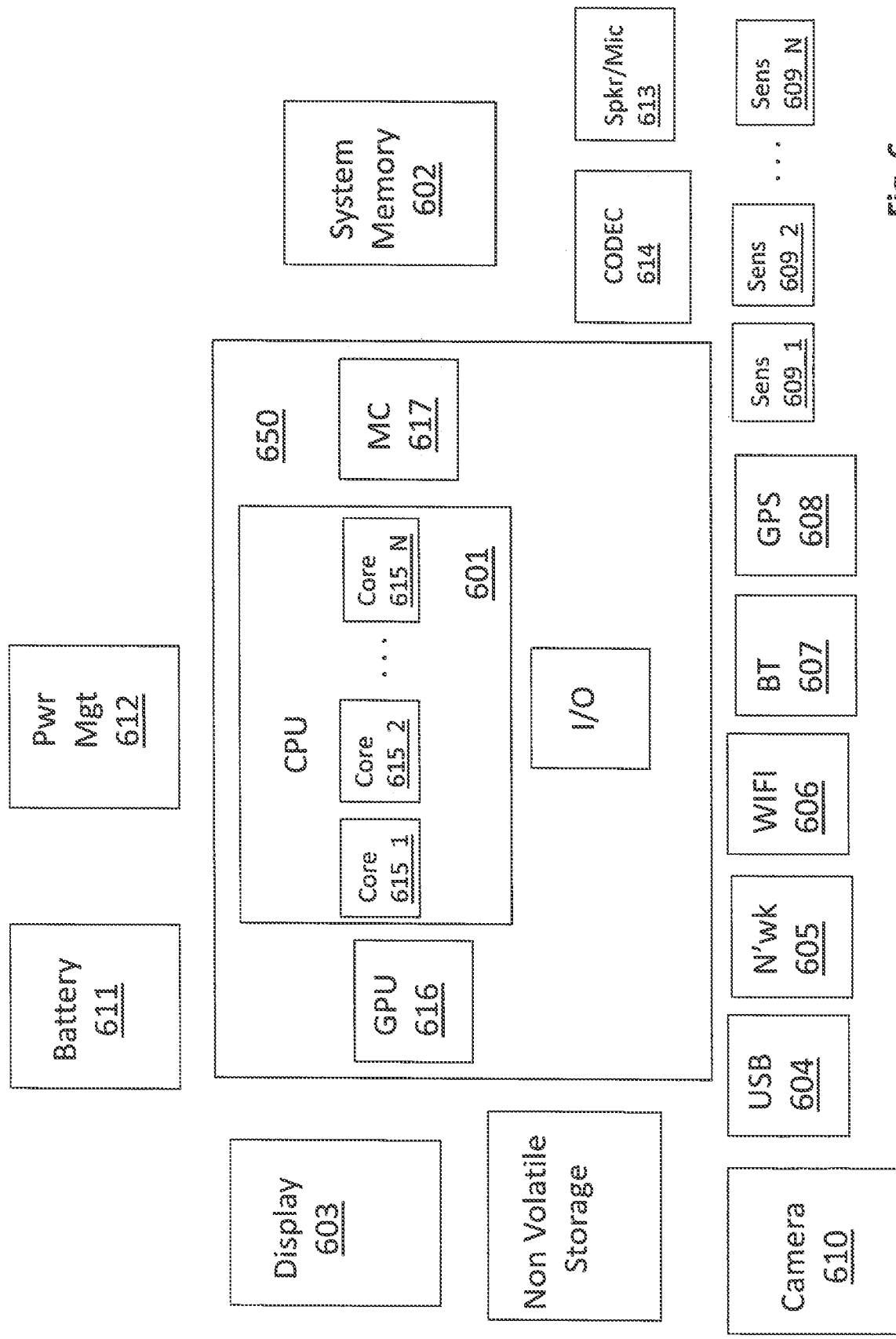
FIG. 6 shows a computing system.

FIG. 6 shows a depiction of an exemplary computing system 600 such as a personal computing system (e.g., desktop or laptop) or a mobile or handheld computing system such as a tablet device or smartphone, or, a larger computing system such as a server computing system. As observed in FIG. 6, the basic computing system may include a central processing unit 601 (which may include, e.g., a plurality of general purpose processing cores and a main memory controller disposed on an applications processor or multi-core processor), system memory 602, a display 603 (e.g., touchscreen, flat-panel), a local wired point-to-point link (e.g., USB) interface 604, various network I/O functions 605 (such as an Ethernet interface and/or cellular modem subsystem), a wireless local area network (e.g., WiFi) interface 606, a wireless point-to-point link (e.g., Bluetooth) interface 607 and a Global Positioning System interface 608, various sensors 609_1 through 609_N (e.g., one or more of a gyroscope, an accelerometer, a magnetometer, a temperature sensor, a pressure sensor, a humidity sensor, etc.), a camera 610, a battery 611, a power management control unit 612, a speaker and microphone 613 and an audio coder/decoder 614.

An applications processor or multi-core processor 650 may include one or more general purpose processing cores 615 within its CPU 601, one or more graphical processing units 616, a memory management function 617 (e.g., a memory controller) and an I/O control function 618. The general purpose processing cores 615 typically execute the operating system and application software of the computing system. The graphics processing units 616 typically execute graphics intensive functions to, e.g., generate graphics information that is presented on the display 603. The memory control function 617 interfaces with the system memory 602.

Each of the touchscreen display 603, the communication interfaces 604-607, the GPS interface 608, the sensors 609, the camera 610, and the speaker/microphone codec 613, 614 all can be viewed as various forms of I/O (input and/or output) relative to the overall computing system including, where appropriate, an integrated peripheral device as well (e.g., the camera 610). Depending on implementation, various ones of these I/O components may be integrated on the applications processor/multi-core processor 650 or may be located off the die or outside the package of the applications processor/multi-core processor 650.

The aforementioned transistor device may be integrated into various ones of the different computing system components described above, such as being integrated within a semiconductor chip. The specific circuitry that the device is integrated into may be logic circuitry implemented as any of an application specific integrated circuit (ASIC), a programmable logic device (PLD) circuit, or a field programmable gate array (FPGA) circuit.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

A FINFET device has been described. The FINFET device comprises a channel comprising a first semiconductor material that is epitaxially grown on a subfin structure beneath the channel. The subfin structure comprises a second semiconductor material that is different than the first semiconductor material. The subfin structure is epitaxially grown on a substrate comprising a third semiconductor material that is different than the first and second semiconductor materials. The subfin structure has a doped region to substantially impede leakage currents between the channel and the substrate.

The doped region may be a p type doped region. The p type doped region may comprise any of: carbon; manganese; zinc. The substrate may comprise silicon. The subfin may comprise any of: gallium arsenide; indium phosphide; indium aluminum arsenide; indium arsenide; indium gallium arsenide; indium antimony; indium arsenide antimony. The doped region may be closer to the substrate than to the channel.

An apparatus having the FINFET device has been described. The apparatus may comprise a computing system. The FINFET device within the computing system may comprise a channel comprising a first semiconductor material that is epitaxially grown on a subfin structure beneath the channel. The subfin structure of the FINFET device within the computing system comprises a second semiconductor material that is different than the first semiconductor material. The subfin structure is epitaxially grown on a substrate comprising a third semiconductor material that is different than the first and second semiconductor materials. The subfin structure has a doped region to substantially impede leakage currents between the channel and the substrate. The doped region is a p type doped region. The p type doped region may comprise any of: carbon; manganese; zinc. The substrate may comprise silicon. The subfin structure of the FINFET device within the computing system may comprise any of: gallium arsenide; indium phosphide; indium aluminum arsenide; indium arsenide; indium gallium arsenide; indium antimony; indium arsenide antimony. The doped region may be closer to the substrate than to the channel.

A method is also described. The method includes manufacturing a FINFET transistor. The manufacturing comprises epitaxially growing a subfin structure on a substrate where the subfin structure and the substrate are different semiconductor materials. The manufacturing also comprises doping the subfin structure with impurities. The manufacturing also comprises epitaxially growing a channel on the subfin structure where the channel is composed of a different semiconductor material than either the subfin structure and the substrate where the impurities create an energy band structure across the channel/subfin/substrate that substantially impedes leakage current between the channel and the substrate.

The doping may be performed at a level of the subfin structure that is closer to the substrate than to the channel. The impurities may include any of: carbon; manganese; zinc. The substrate may comprise silicon. The subfin may comprise any of: gallium arsenide; indium phosphide; indium aluminum arsenide; indium arsenide; indium gallium arsenide; indium antimony; indium arsenide antimony.

The invention claimed is:

1. An apparatus, comprising:
   a FINFET device comprising a channel comprising a first semiconductor material that is epitaxially grown on a subfin structure beneath the channel, the subfin structure comprising a second semiconductor material that is different than the first semiconductor material, the subfin structure being epitaxially grown on a substrate comprising a third semiconductor material that is different than the first and second semiconductor materials, the subfin structure in a trench in a dielectric layer, the dielectric layer having a bottom surface, and the subfin structure having an upper region above a doped region, the doped region to substantially impede leakage currents between the channel and the substrate, wherein the doped region has a bottom surface below the bottom surface of the dielectric layer, wherein the doped region has a top surface above the bottom surface of the dielectric layer, and wherein the doped region has a higher concentration of dopants than a concentration of dopants in the upper region of the subfin structure.

2. The apparatus of claim 1 wherein the doped region is a p type doped region.

3. The apparatus of claim 2 wherein the p type doped region comprises any of:
   carbon;
   manganese;
   zinc.

4. The apparatus of claim 1 wherein the substrate comprises silicon.

5. The apparatus of claim 4 wherein the subfin structure comprises any of:
   gallium arsenide;
   indium phosphide;
   indium aluminum arsenide;
   indium arsenide;
   indium gallium arsenide;
   indium antimony;
   indium arsenide antimony.

6. The apparatus of claim 1 wherein the subfin structure comprises any of:
   gallium arsenide;
   indium phosphide;
   indium aluminum arsenide;
   indium arsenide;
   indium gallium arsenide;
   indium antimony;
   indium arsenide antimony.

7. The apparatus of claim 1 wherein the doped region is closer to the substrate than to the channel.

8. A computing system, comprising:
   one or more processing cores;
   a system memory;
   a memory controller coupled to the system memory;
   a networking interface;
   a semiconductor chip comprising a FINFET transistor, said FINFET transistor comprising a channel, said channel comprising a first semiconductor material that is epitaxially grown on a subfin structure beneath the channel, the subfin structure comprising a second semiconductor material that is different than the first semiconductor material, the subfin structure in a trench in a dielectric layer, the dielectric layer having a bottom surface, and the subfin structure being epitaxially grown on a substrate comprising a third semiconductor material that is different than the first and second semiconductor materials, the subfin structure having an upper region above a doped region, the doped region to substantially impede leakage currents between the channel and the substrate, wherein the doped region has a bottom surface below the bottom surface of the dielectric layer, wherein the doped region has a top surface above the bottom surface of the dielectric layer, and wherein the doped region has a higher concentration of dopants than a concentration of dopants in the upper region of the subfin structure.

9. The computing system of claim 8 wherein the doped region is a p type doped region.

10. The computing system of claim 9 wherein the p type doped region comprises any of:
    carbon;
    manganese;
    zinc.

11. The computing system of claim 8 wherein the substrate comprises silicon.

12. The computing system of claim 11 wherein the subfin structure comprises any of:
    gallium arsenide;
    indium phosphide;
    indium aluminum arsenide;
    indium arsenide;
    indium gallium arsenide;
    indium antimony;
    indium arsenide antimony.

13. The computing system of claim 8 wherein the subfin structure comprises any of:
gallium arsenide;
indium phosphide;
indium aluminum arsenide,
indium arsenide;
indium gallium arsenide;
indium antimony;
indium arsenide antimony.

14. The computing system of claim 8 wherein the channel is comprised of gallium arsenide doped to be n type.

* * * * *